United States Patent [19]

Zatler et al.

[11] Patent Number: 5,227,791

[45] Date of Patent: Jul. 13, 1993

[54] EAST HIGH-BIT ONE STEP ELECTRONIC ANALOG-TO-DIGITAL CONVERTER

[76] Inventors: Andrej Zatler, Askerceva 24, Maribor, Slovenia, 62000; Franc Eferl, Pri soli 45, Kamnica, Slovenia, 62351

[21] Appl. No.: 804,582

[22] Filed: Dec. 10, 1991

[51] Int. Cl.[5] ............................................. H03M 1/12
[52] U.S. Cl. .................................... 341/127; 341/155
[58] Field of Search ............... 341/127, 132, 155, 156, 341/161

[56] References Cited

U.S. PATENT DOCUMENTS 3,641,562 2/1972 Kobayashi et al. ............. 341/161 X
3,688,221 8/1972 Fruhalf .......................... 341/132 X

FOREIGN PATENT DOCUMENTS 2414865 10/1975 Fed. Rep. of Germany .
3829730 4/1989 Fed. Rep. of Germany .

Primary Examiner—A. D. Pellinen
Assistant Examiner—Brian K. Young
Attorney, Agent, or Firm—Keck, Mahin & Cate

[57] ABSTRACT

The converter input i is connected through a comparator to the polarity bit output as well as to the input of a full-wave precision rectifier in the first quantization stage, which like further stages comprises an operational amplifier, a comparator and an exclusive OR gate, the output of which is connected to the output for the first bit. To the inverting input of the amplifier with the gain equal to 2 through the potentiometer a voltage $-U_o/2$ is fed, $(-U_o, +U_o)$ being the interval of the input voltage. The input of the rectifier is connector to the input i and the input of the rectifier in further stages is connected to the output of the operational amplifier in the previous stage. The second input of the exclusive OR gate is connected to the bit output of the previous stage.

1 Claim, 2 Drawing Sheets

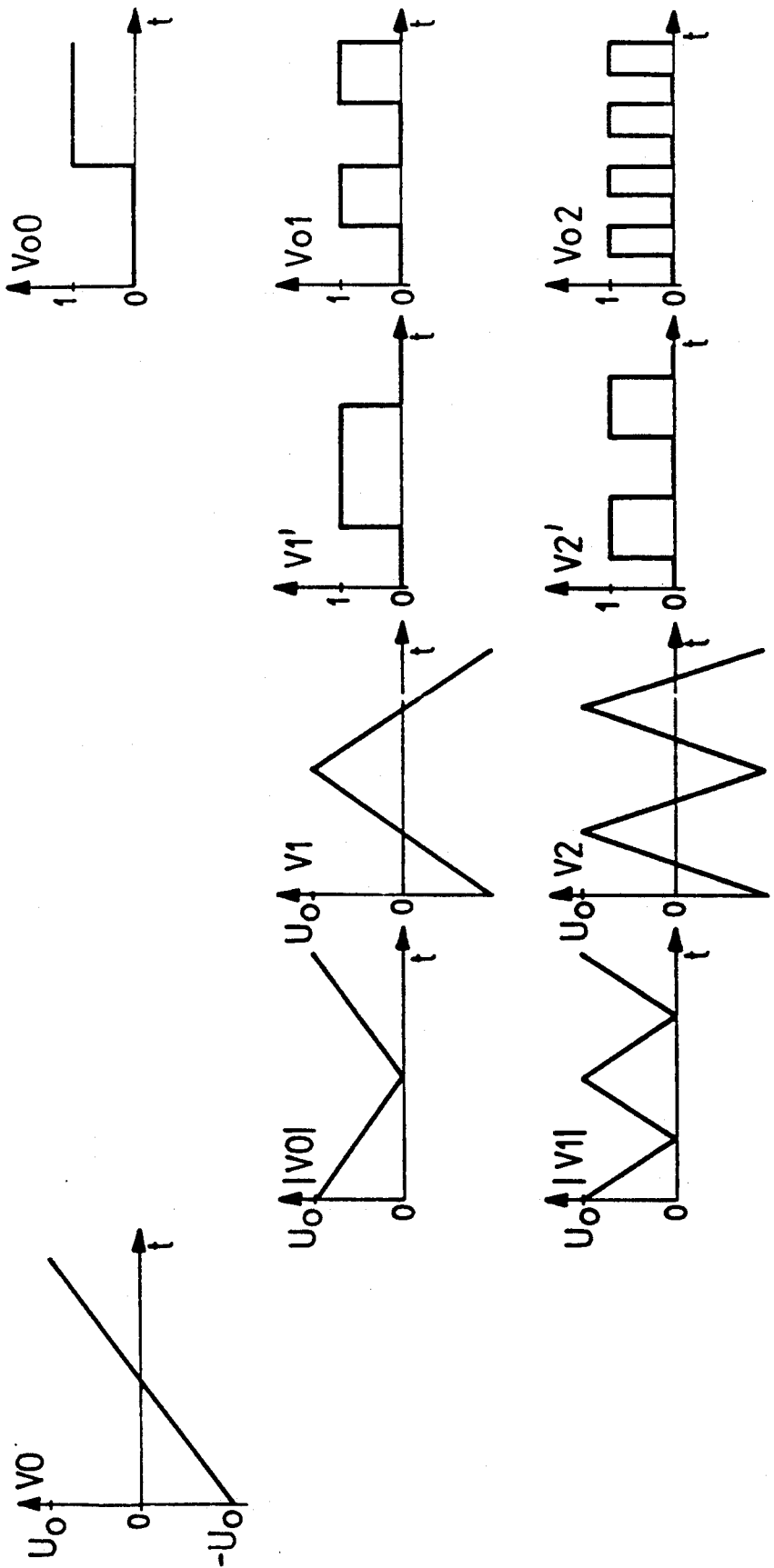

EAST HIGH-BIT ONE STEP ELECTRONIC ANALOG-TO-DIGITAL CONVERTER

BACKGROUND OF THE INVENTION

1. Technical Field

This application relates generally to electronic analog-to-digital converters.

2. Description of the Prior Art

In the majority of known electronic analog-to-digital converters the consecutive conversion of the analog input voltage into the digital output representation thereof is performed. Such a 5-bit converter is described in the published patent application DE 24 14 865 A1. When determining the value of a specific bit, across a gated amplifier, i.e. one of the 5 present, which is picked out by a logic unit, the voltage of the level assigned to this bit is fed to either input of a comparator, to the other input of which the analog voltage to be converted is fed. The bit values are determined by the logic unit. The determination process starts at the most significant bit and is continued step-by-step to the bit with the smallest weight.

Further, from the published patent application DE 38 29 730 A1 there has been known a sequential electronic analog-to-digital converter, in which the analog voltage input and the output of a digital-to-analog converter are connected to the inverting input of a comparator, the other input of which is grounded and the output of which is connected to the input of a register. The output of the register is connected by bus to the input of the afore-mentioned digital-analog converter. The described converter performs a fast convergence to the actual digital representation of the input voltage.

In sequential electronic analog-to-digital converters some time is needed to perform the quantization of the input voltage into all bits of the output digital representation. Therefore a conversion of fast varying signals is not feasible. Additionally, because of the non-synchronous appearance of digital output signals, latches are needed, which increases the complexity of such converters.

In parallel electronic analog-to-digital converters, however, for the complete conversion only one step is needed and hence the quantization time is shorter. There has been known a flash analog-to-digital converter. In the N-bit flash converter the input voltage is fed to either inputs of $2^N-1$ comparators, the other inputs of which are connected to the outputs of a voltage divider being composed of the same number of resistors to obtain the $2^N-1$ quantization voltage levels. The output of each comparator is through its own latch-all latches being connected to a common clock-connected to the relevant input of an encoder, at the output of which the digital representation of the input voltage appears. At high N the circuitry of the flash converter is of a considerable size and therefore the upper frequency operating limit is set by the time of flight of a signal across the converter.

SUMMARY OF THE INVENTION

In accordance with the foregoing background discussion, an object of this invention is to provide an electronic analog-to-digital converter which will make possible a high-bit conversion of fast varying analog input voltages, whereat the conversion should be performed in one step and without sampling.

Advantageously, the electronic analog-to-digital converter of the invention is made of a small number of components, yet it nevertheless makes possible the conversion of high-frequency input analog voltages into their high-bit digital representation.

Other objects, advantages and features of the invention will be apparent from the following detailed description of the embodiment thereof, when read in conjunction with the accompanying drawings.

BRIEF DESCRIPTION OF THE DRAWINGS

In the drawings,

FIGS. 2a to 2e are graphs vs time of the input analog voltage, of the absolute voltage value at the input of the quantization stages 1 and 2 as well as of the voltages at the output of the operational amplifier, at the output of the comparator and at the output of the two afore-mentioned stages.

DETAILED DESCRIPTION OF THE PREFERRED EMBODIMENT

Figure 1:
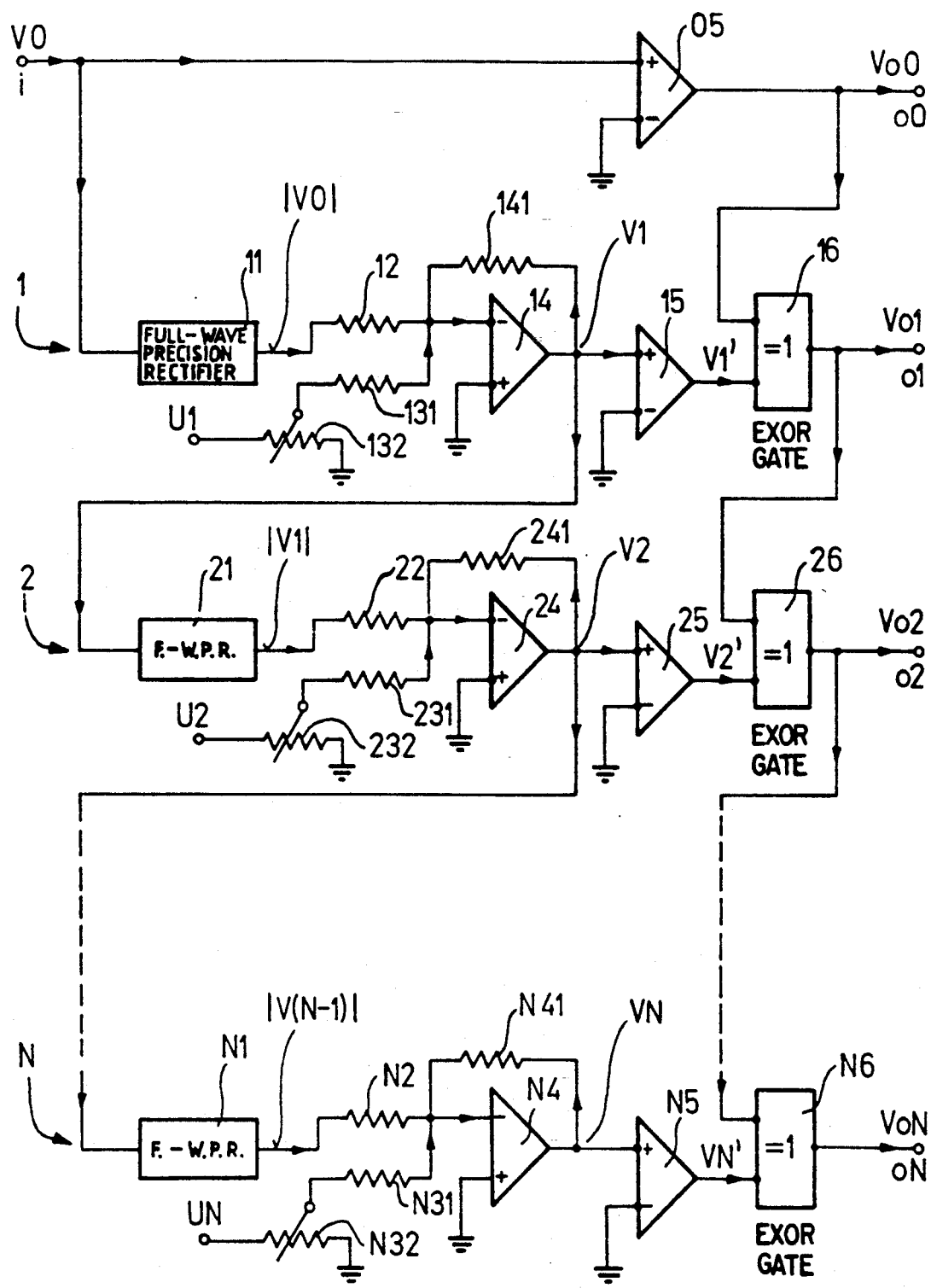
FIG. 1 represents the N-bit electronic analog-to-digital converter according to the invention.

A circuit of the electronic analog-to-digital converter according to the invention is shown in FIG. 1. The converter is designed for the conversion of analog voltage signals V0 of an amplitude within the voltage interval $(-U_o, +U_o)$.

In the polarity quantization stage the converter input i is connected to the noninverting input of a comparator 05, the inverting input of which is grounded. The output of the comparator 05 is connected to the output o0 for the polarity bit that defines the polarity of the input analog voltage V0.

Quantization stages 1, ..., N for the determination of the values of several bits are identical. In each quantization stage 1, ..., N the inverting output of an operational amplifier 14, ..., N4, the noninverting input of which is grounded, is connected through a resistor 12, ..., N2 to the output of a full-wave precision rectifier 11, ..., N1 and through a resistor 131, ..., N31 to the sliding contact of a potentiometer 132, ..., N32. The first fixed contact of this potentiometer is grounded and the other one is connected to a voltage source U1, ..., UN. The inverting input of the operational amplifier 14, ..., N4 is further connected through a resistor 141, ..., N41 to the output of this operational amplifier and to the noninverting input of a comparator 15, ..., N5, the inverting input of which is grounded. The output of this comparator is connected to the first input of an exclusive OR gate 16, ..., N6, the output of which is connected to the output o1, ..., oN for the relevant bit. The polarity quantization stage and the remaining quantization stages are interconnected so that the input of the rectifier 11 in the quantization stage 1 is connected to the converter input i, in any other stage 2, ..., N, however, the input of the rectifier 21, ..., N1 is connected to the output of the operational amplifier 14, 24, ..., (N−1)4 in the previous quantization stage, and that the second input of the exclusive OR gate 16, 26, ..., N6 is connected to converter output o0, o1, ..., o(N−1) of the previous quantization stage.

The gain of the operational amplifiers 14, ..., N4 equals 2. The potentiometers 132, 232, ..., N32 are adjusted so that their sliding contact is brought to a voltage $-U_o/2$. The adjusting of these voltages in the converter according to invention is started at the potentiometer 132 in the first quantization stage 1. The voltage on its sliding contact is allowed to differ from the ideal one stated above by an offset error of the operational amplifier 14, the amplifier gain error, however, can also be taken into account. Step by step, the entire converter is adjusted.

The electronic analog-to-digital converter of the invention operates as follows. The variations of the input analog voltage V0, which varies in time within the limits $-U_o$ and $+U_o$, e.g. $U_o$ being equal to 10 V, and is fed to the converter input i, are reflected with small time delays in voltages V1, V2, ..., VN at the output of the operational amplifiers in any quantization stage 1, 2, ..., N. Therefore these time delays relative to the input analog voltage V0, its time dependence is shown in FIG. 2a, do not become apparent in FIGS. 2b, 2c, 2d and 2e. At the outputs of the full-wave precision rectifiers 11, 21, ..., N1 the voltages |V0|, |V1|, ..., |V(N−1)| appear (FIG. 2b), which are equal to the absolute values of the voltages Vo, V1, ..., V(N−1). As soon as the input analog voltage V0 does not have a constant value, the voltages |Vi| from some definite quantization stage on have a broken line time dependence and the number of zero crossings of the voltages V1, V2, ... at the output of the operational amplifiers 14, 24, ... is doubled from one stage to the next one (FIG. 2c). The zero-crossings of the voltages V1, V2, ..., VN are represented by voltage pulses V1', V2', ..., VN' at the output of the comparators 15, 25, ..., N5 (FIG. 2d). At the output of the exclusive OR gates 16, 26, ..., N6 the pulses Vo1, Vo2, ..., VoN appear (FIG. 2e), which pulses together with the polarity bit pulse Vo0 represent the N-bit digital representation of the input analog voltage V0. Either input of the exclusive OR gate 16, 26, ..., N6 is connected to the digital output o0, o1, ..., o(N−1) for the previous bit. At the outputs o0, o1, ..., oN the digital representation of the input analog voltage V0 appears practically in the rhythm of the voltage V0. The voltage V0 is represented in the form of an offset binary code, the polarity of the input voltage V0 being expressed at the output o0.

The digital representation of the input analog voltage varies synchronously with the variation of the input analog voltage also for the reason that in the converter according to the invention no sampling is performed in contrast to any other known analog-to-digital converter.

The attainable resolution, i.e. the number N, of the digital representation naturally depends on the quality of the built-in electronic elements. In the embodiment of the converter a high precision of the digital representation was attained even at $N \geq 20$. In principle, however, the upper frequency operating limit is determined just by the time delay of the variation of the voltages VN with respect to the variation of the input analog voltage V0, i.e. by the converter circuitry size.

The electronic analog-to-digital converter according to the invention can be used for various purposes. The advantage of the converter of the invention clearly comes to light wherever the output digital representation must be available in real time, which means that it must change synchronously with the input variable. Consequently, the converter of the invention is advantageously used in control systems for fast varying input variables, high precision digital voltmeters, storage oscilloscopes, transducers for transducing non-electrical variables into electrical ones, and in similar applications.

What is claimed is:

1. An electric analog-to-digital converter designed to convert analog voltage signals of an amplitude within the voltage interval $(-U_o, +U_o)$ to a N-bit digital output representation of these signals, wherein the input (i) of the converter is connected to the noninverting input of a comparator (05), the inverting input of which is grounded and the output of which is connected to a polarity bit output (o0), characterized in that in a quantization stage (1, ..., N) the inverting input of an operational amplifier (14, ..., N4), the inverting input of which is grounded, is connected through a resistor (12, ..., N2) to the output of a full-wave precision rectifier (11, ..., N1) and is connected through a resistor (131, ..., N31) to a voltage $U_o/2$, and is connected through a resistor (141, ..., N41) to the output of the operational amplifier (14, ..., N4), the gain of which is equal to 2, and to the noninverting input of a comparator (15, ..., N5), the inverting input of which is grounded and the output of which is connected to the first input of an exclusive OR gate (16, ..., N6), the output of which is connected to the output (o1, ..., oN) for a relevant bit, and that the input of the full-wave precision rectifier (11) is connected to the input (i) and the input of a next stage full-wave precision rectifier (21, ..., N1) is connected to the output of the operational amplifier (14, ..., (N−1) 4) and the second input of the exclusive OR gate (16, ..., N6) is connected to the digital output (o0, ..., (N−1)).

* * * * *

UNITED STATES PATENT AND TRADEMARK OFFICE
CERTIFICATE OF CORRECTION

PATENT NO. : 5,227,791
DATED : July 13, 1993
INVENTOR(S) : Zatler et al.

It is certified that error appears in the above-identified patent and that said Letters Patent is hereby corrected as shown below:

Title Page, item [54]

IN THE TITLE:

Please correct the title to read --FAST HIGH-BIT ONE STEP ELECTRONIC ANALOG-TO-DIGITAL CONVERTER--.

IN THE FOREIGN APPLICATION PRIORITY DATA: [30]

Please add the following priority data:

--Dec. 10, 1990    Slovenia . . . . . P-2321/90--.

Signed and Sealed this

Eleventh Day of April, 1995

Attest:

BRUCE LEHMAN

*Attesting Officer*      *Commissioner of Patents and Trademarks*